(12) United States Patent
Wu et al.

(10) Patent No.: US 9,356,120 B2
(45) Date of Patent: May 31, 2016

(54) METAL GATE TRANSISTOR AND METHOD FOR TUNING METAL GATE PROFILE

(71) Applicant: Taiwan Semiconductor Manufacturing Company, Ltd., Hsin-Chu (TW)

(72) Inventors: Po-Chi Wu, Zhubei (TW); Buh-Kuan Fang, Zhubei (TW); Yung-Jung Chang, Cyonglin Township (TW); Po-Hsiung Leu, Lujhu Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/145,684

(22) Filed: Dec. 31, 2013

(65) Prior Publication Data
US 2015/0187939 A1    Jul. 2, 2015

(51) Int. Cl.
| H01L 21/28 | (2006.01) |
| H01L 29/66 | (2006.01) |
| H01L 21/3105 | (2006.01) |
| H01L 29/423 | (2006.01) |
| H01L 29/49 | (2006.01) |
| H01L 29/51 | (2006.01) |

(52) U.S. Cl.
CPC .... *H01L 29/66545* (2013.01); *H01L 21/28114* (2013.01); *H01L 21/3105* (2013.01); *H01L 29/42376* (2013.01); *H01L 29/4966* (2013.01); *H01L 29/517* (2013.01); *H01L 29/6656* (2013.01)

(58) Field of Classification Search
CPC ............... H01L 21/823456; H01L 21/823885
See application file for complete search history.

(56) References Cited

U.S. PATENT DOCUMENTS

| 7,208,361 | B2 * | 4/2007 | Shah et al. ................. 438/199 |
| 7,422,936 | B2 | 9/2008 | Barns et al. |
| 7,595,248 | B2 * | 9/2009 | Hattendorf et al. ........... 438/302 |
| 8,530,317 | B1 | 9/2013 | Wu et al. |
| 2003/0064154 | A1 * | 4/2003 | Laxman et al. .......... 427/255.28 |
| 2009/0212372 | A1 * | 8/2009 | Yamasaki ..................... 257/369 |
| 2011/0156154 | A1 * | 6/2011 | Hoentschel et al. .......... 257/369 |

* cited by examiner

*Primary Examiner* — Lex Malsawma
(74) *Attorney, Agent, or Firm* — Slater Matsil, LLP

(57) ABSTRACT

A semiconductor device having arrays of metal gate transistors is fabricated by forming a number of dummy gate structures including a first gate dielectric layer and a dummy gate material layer overlying the first gate dielectric layer, depositing a tensile ILD layer between the dummy gate structures, stressing the tensile ILD layer, removing at least the dummy gate material to form a number of trenches, and depositing a metal gate material in the trenches, which have a tapered profile.

20 Claims, 11 Drawing Sheets

METAL GATE TRANSISTOR AND METHOD FOR TUNING METAL GATE PROFILE

BACKGROUND

In an effort to increase device densities and reduce critical dimensions (CDs) in semiconductor devices, traditional gate structures are replaced with gates having high-k dielectrics and metal electrodes. High-k dielectrics can provide enhanced capacitance in comparison to an equivalent thickness of silicon oxide. A metal electrode with a specified work function can avoid charge carrier depletion proximate to the electrode interface with the high-k dielectric. However, the electrodes for p-channel and n-channel transistors may require different metals to provide specified work functions.

Some metals for gate electrodes can be adversely affected by processing used to form source and drain regions; particularly, annealing to repair source and drain implant damage can shift the work function of electrode metals. This has led to various new manufacturing processes, including replacement gate (gate-last) processes. In a replacement gate process, a gate stack is formed with polysilicon in place of the electrode metal. After source and drain regions are formed and annealed, the polysilicon is removed to form trenches which are then filled with the desired electrode metals.

It is difficult to adequately fill the trenches as gate size decreases. In addition to small feature size, the gaps created by dummy gate removal during the gate last process often have different profiles at different portions of a transistor array, due to localized etching effects. Gaps at an edge of a transistor array and gaps toward a center of the transistor array can have different profiles (for example, re-entrant and vertical, respectively) and therefore different process requirements to fill adequately. Tuning the process to fill adequately for different profiles is difficult.

Attempts at improving the gate fill includes forming a tapered dummy gate such that the worst edge profile after dummy gate removal is vertical, instead of re-entrant. However, a tapered dummy gate shadows the self-aligned implantation processes and form varying doped regions in a transistor array. Further, formation of a tapered dummy gate involves hard-to-control re-entrant etching of polysilicon. Thus, improvements in gate-fill in a gate last process continue to be sought.

BRIEF DESCRIPTION OF DRAWINGS

The present disclosure may be understood from the following detailed description when read with the accompanying figures. It is emphasized that in accordance with the standard practice in the industry various features may not be drawn to scale and are used for illustration purposes only. In fact, the dimensions of the various features in the drawings may be arbitrarily increased or reduced for clarity of discussion.

DETAILED DESCRIPTION

Figure 1:
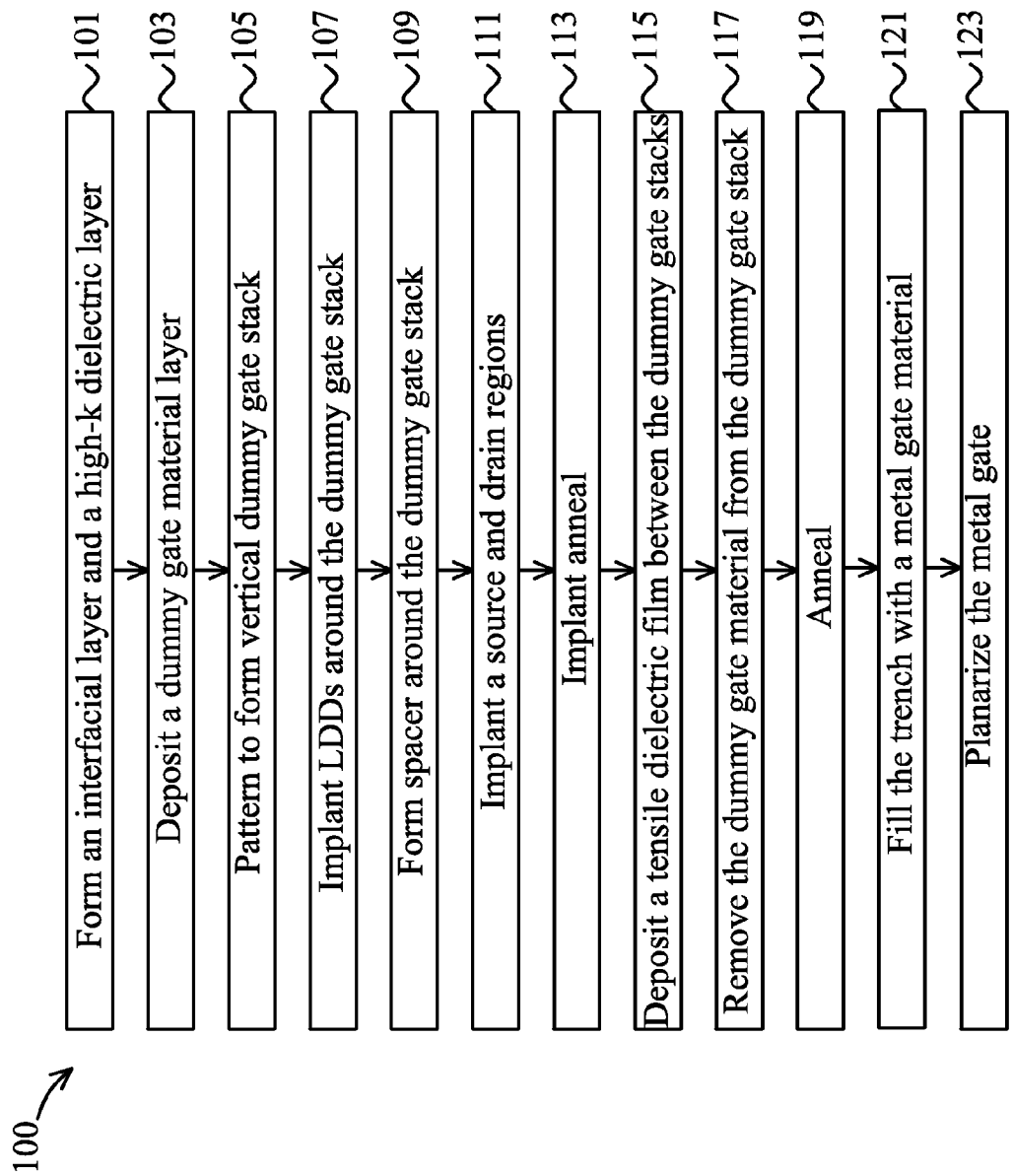
FIG. 1 is a flowchart illustrating a method of fabricating a MOS device comprising a metal gate structure according to some embodiments.

The following disclosure provides many different embodiments, or examples, for implementing different features of the invention. Specific examples of components and arrangements are described below to simplify the present disclosure. These are of course, merely examples and are not intended to be limiting. For example, the formation of a first feature over or on a second feature in the description that follows includes embodiments in which the first and second features are formed in direct contact, and also includes embodiments in which additional features are formed between the first and second features.

In a replacement gate process, the shape of the dummy gate stack is the inverse of the shape of inter-level dielectric ILD around the dummy gate stack. The dummy gate material layers are etched to form trenches for the ILD filling, and then the dummy gate material is removed from the dummy gate stack to form trenches for the replacement gate filling. Thus, both of these shapes are etched and filled at least once. If by process tuning the trench for ILD is made to have a wider opening and therefore easier to etch and fill, then the dummy metal gate removal and replacement gate filling would be difficult with a reentrant shape, having a smaller opening than the bottom. Voids in the metal gate stack can affect the electrical properties of the transistor and reduce yield. If by process tuning the dummy gate stack is made to have a wider top and therefore easier to etch and fill, then the ILD etch and filling would be difficult with a reentrant shape, having a smaller opening than the bottom. Further, a dummy gate stack having a non-vertical profile reduces implant process control, as different portions of the transistor array may have different shadowing, resulting in varying doped regions. On the other hand, voids in the ILD can reduce the structural integrity of the ILD during subsequent processes and cause current leakage, which can also reduce yield.

Various embodiments of the present disclosure pertain to a method and structure for a high-k metal gate transistor that involves profile shaping of the replacement gate trench during fabrication. A dummy gate stack with a vertical profile is used to self-align implantation processes. After a tensile ILD layer is deposited and before a replacement gate is deposited, the tensile ILD layer is stressed by a treatment to increase cross-linking and shrink the tensile ILD layer. The stress treatment results in strain of the ILD layer that pulls the spacers away from the replacement gate trench and result in a replacement gate trench that is wider on top and easier to fill completely without voids. The stress treatment may be performed before the dummy gate removal and may render the dummy gate material easier to etch. The stress treatment may be also performed after the dummy gate removal. Having an open trench as a weak point during the stress treatment reduces the likelihood of the strain causing material delamination.

FIG. 1 is a flow chart of a replacement gate process 100 according to various embodiments of the present disclosure. FIGS. 2 through 11 illustrate a wafer 200 as it progresses through the process 100. The wafer 200 is a semiconductor device at an intermediate stage of manufacture. The process 100 can be applied to any semiconductor device and does not require the specific features of the wafer 200.

The wafer 200 includes a semiconductor substrate 201. Examples of semiconductors include silicon, silicon on insulator (SOI), Ge, SiC, GaAs, GaAlAs, InP, GaNSiGe. The semiconductor substrate 201 may be doped of either n-type or p-type, or undoped. The process 100 adds metal oxide semiconductor field effect transistors (MOSFETs) to the wafer 200. These can be of the n-type, the p-type or both types in one complementary metal oxide semiconductor (CMOS) process. In some embodiments, the wafer 200 includes n-well regions, p-well regions, or both. As an example and with reference to FIG. 2, the wafer 200 includes an isolation region 231 that isolates an n-doped region 216 from a p-doped region 218. The isolation region 231 is generally a shallow trench isolation (STI) region but can also be an isolation region based on local oxidation of silicon (LOCOS). The isolation region 231 is filled by a dielectric material. Examples of suitable dielectrics include silicon oxide, silicon nitride, silicon oxynitride, and multiple layers or combinations thereof.

Figure 2:
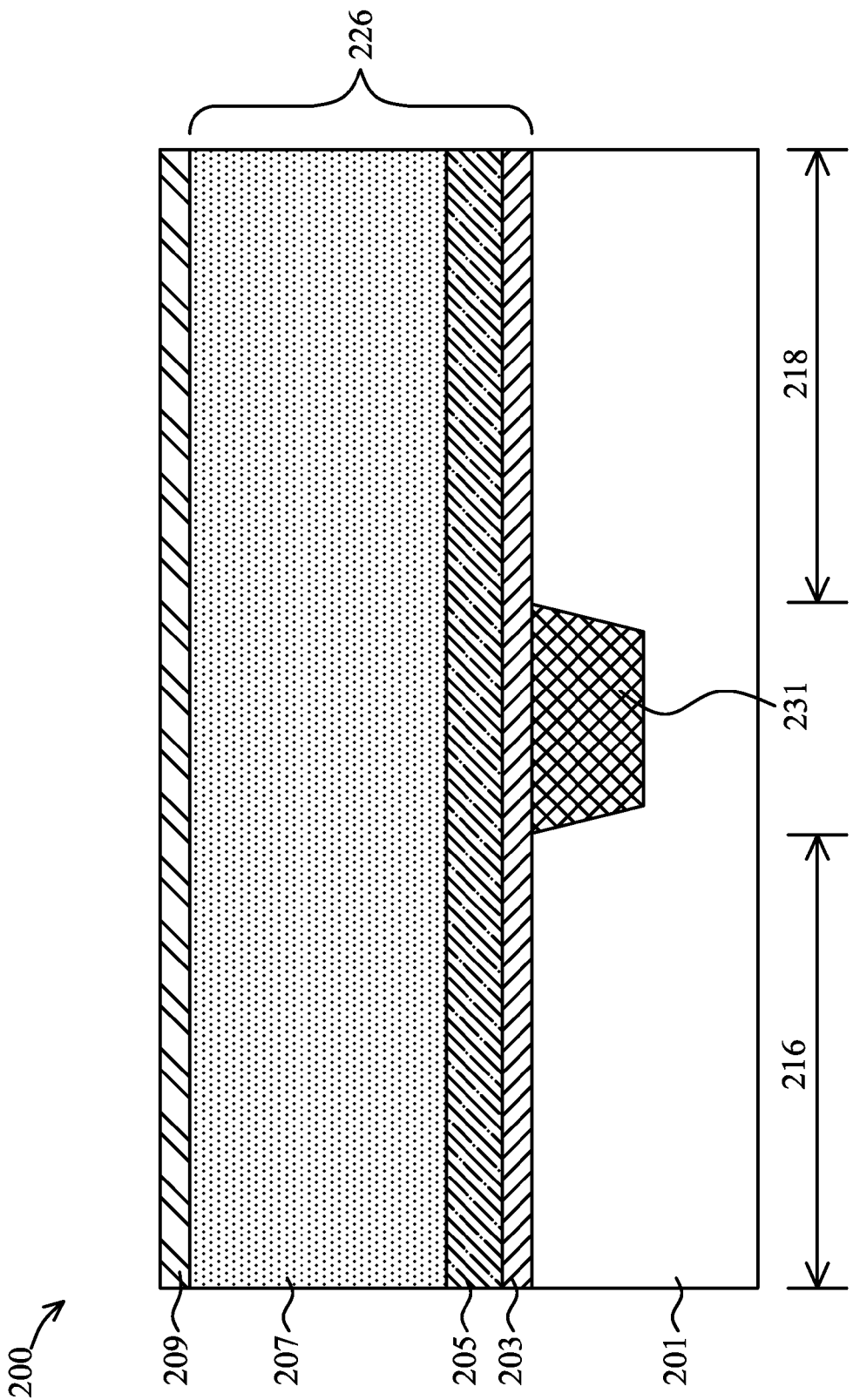
FIGS. 2-11 are schematic cross-sectional views of a metal gate structure of an MOS device at various stages of fabrication according to some embodiments.
Figure 3:
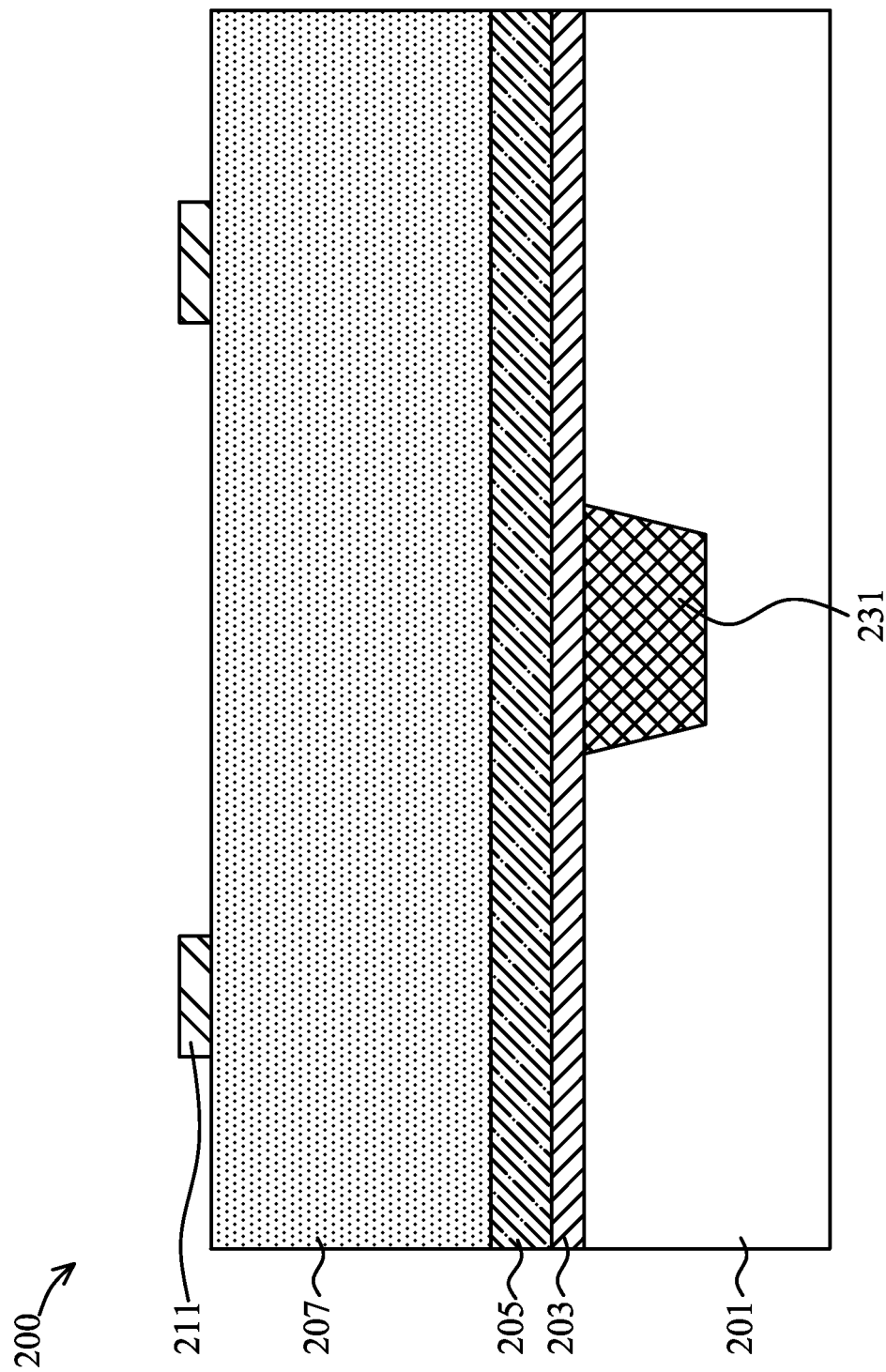

Operation 101 involves forming an interfacial layer and a high-k dielectric layer. In FIG. 2, the interfacial layer 203 is the interface between the semiconductor substrate 201 and the high-k dielectric layer (gate dielectric) 205. The interfacial layer 203 typically comprises silicon oxide or silicon oxynitride. An interfacial layer can form spontaneously as a result of wet cleans of the wafer 200 prior to the formation of the semiconductor substrate 201 or as a result of interaction between the high-k dielectric layer 205 and the semiconductor substrate 201 during or subsequent to formation of the dielectric layer 205. Intentionally forming the interfacial layer by operation 101 can provide a higher quality interface. The interfacial layer is generally made very thin to minimize the interfacial layer's contribution to the overall equivalent oxide thickness of the resulting gates. The thickness is generally in the range from 1 to 20 Angstroms.

The interfacial layer of silicon oxide can be formed by a suitable process including chemical oxidation, for example, by treating the semiconductor substrate 201 with hydrofluoric acid (HF) immediately prior to depositing the high-k dielectric layer 205. Another process for a silicon oxide interfacial layers is to thermally grow the interfacial layer followed by a controlled etch to provide the desired layer thickness. In some cases, the interfacial layer can be formed after the high-k dielectric layer 205. For example, a silicon oxynitride interfacial layer can be formed by annealing a wafer 200 with a silicon semiconductor substrate 201 and a hafnium-based high-k dielectric layer 205 in an atmosphere of nitric oxide. This later process has advantages such as reduced queue time.

The high-k dielectric layer 205 includes one or more layers of one or more high-k dielectric materials. High-k dielectrics are expected to have a dielectric constant, k, of at least or equal to 4.0. Examples of high-k dielectrics include hafnium-based materials such as HfO2, HfSiO, HfSiON, HfTaO, HfTiO, HfZrO, and $HfO_2$-$Al_2O_3$ alloy. Additional examples of high-k dielectrics include $ZrO_2$, $Ta_2O_5$, $Al_2O_3$, $Y_2O_3$, $La_2O_3$, and $SrTiO_3$. The dielectric layer 205 typically has a thickness in the range from 5 to 50 Angstroms. High-k dielectric layer 205 can be formed by chemical vapor deposition (CVD) and atomic layer deposition (ALD).

Optionally, a capping layer may be formed over the dielectric layer 205. Optionally capping layer can protect high-k dielectric layer 205 during subsequent processing and provide an etch stop layer for when the dummy gate layer is removed. The capping layer can include one or more layers of materials, which may include, for example, TiN and TaN. The capping layer can be formed by a deposition process such as CVD, ALD, and electroplating to a specified thickness.

A dummy gate material layer is deposited in operation 103. The dummy gate material layer 207 is typically polysilicon, although other materials can be used. The dummy gate material layer 207 can be formed by a semiconductor deposition process. For example, a polysilicon dummy gate material layer 207 can be formed by pyrolyzing silane. After operations 101 and 103, a dummy gate layer stack 226 is formed on the wafer 200 as shown in FIG. 2. The dummy gate layer stack 226 includes an interfacial layer 203, a high-k dielectric layer 205 and a dummy gate material layer 207.

In operation 105, the dummy gate layer stack 226 is patterned to form vertical dummy gate stacks. Dummy gate stacks may be patterned to define one or more regions of high gate density, which is typical for a core area of an integrated circuit device, and regions of low gate density, which is typical for a peripheral or input/output area of an integrated circuit device.

For small features, patterning can be accomplished by a photolithographic process. Photolithography includes coating the wafer 200 with a photoresist, selectively exposing the photoresist according to a desired pattern, developing the photoresist, and using the pattern photoresist as an etch mask. The patterned photoresist can be used as a mask to etch the dummy gate layer stack 226. Alternatively, the photoresist is used to pattern a hard mask layer. A hard mask layer, if used, is formed before the photoresist. The wafer 200 of FIG. 2 includes a hardmask layer 209 before patterning. The wafer 200 of FIG. 3 includes patterned hard mask features 211. The patterned hard mask features 211 are used as a mask to etch the dummy gate layer stack 226 to form dummy gate stack. Any etch process or combination of etch processes can be used to etch the dummy gate layer stacks 226.

Figure 4:
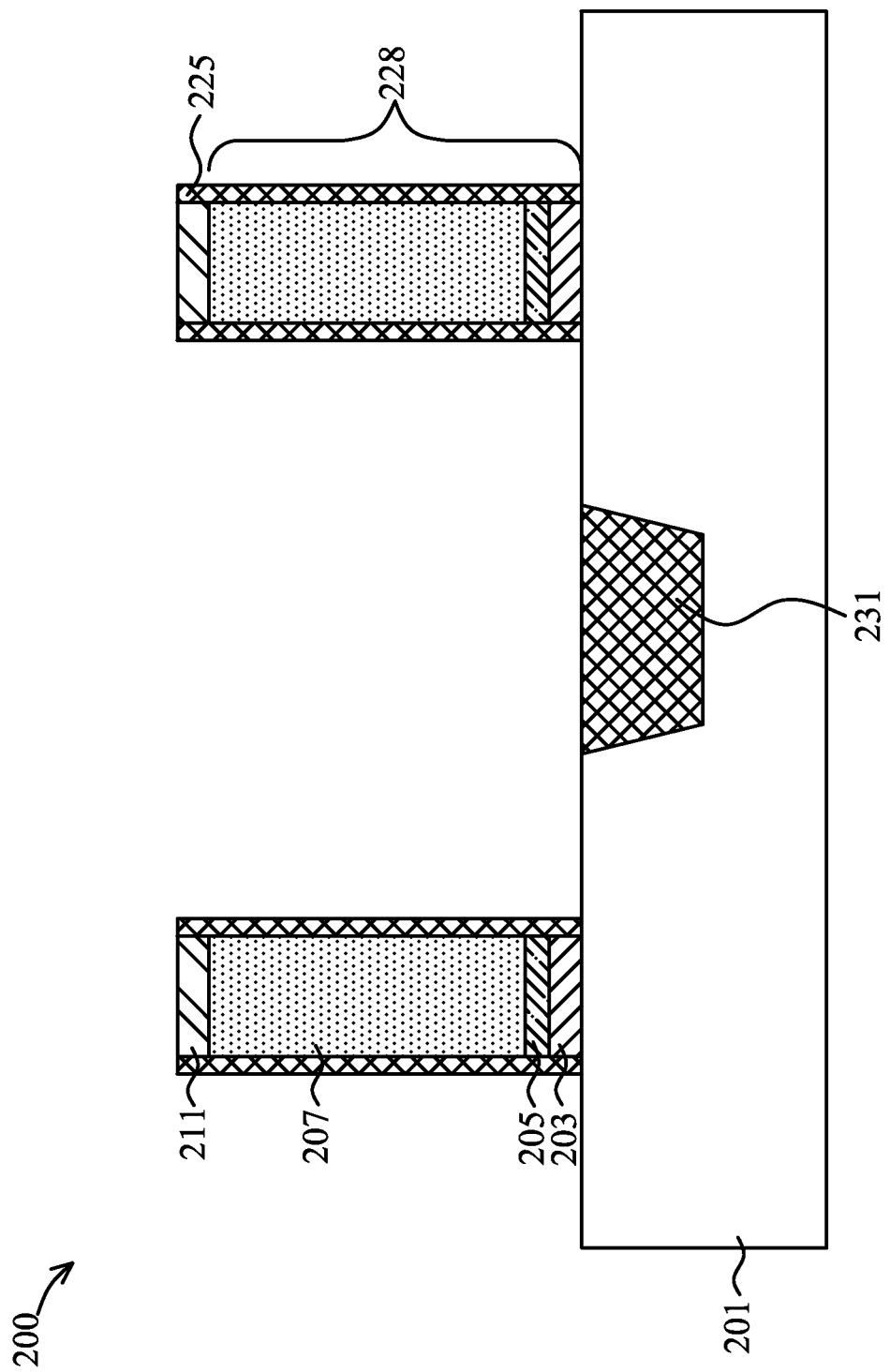

A typical process for etching the dummy gates stack 226 includes a plasma etch. Reactive gases can interact with the wafer 200 during plasma etching to produce volatile byproducts that subsequently redeposit on nearby surfaces. This can result in the formation of an optional passivation layer 225 on the sidewalls of dummy gates 228, as shown in FIG. 4. The optional passivation layer 225 can be silica or a similar material such as a silicate.

Figure 5:
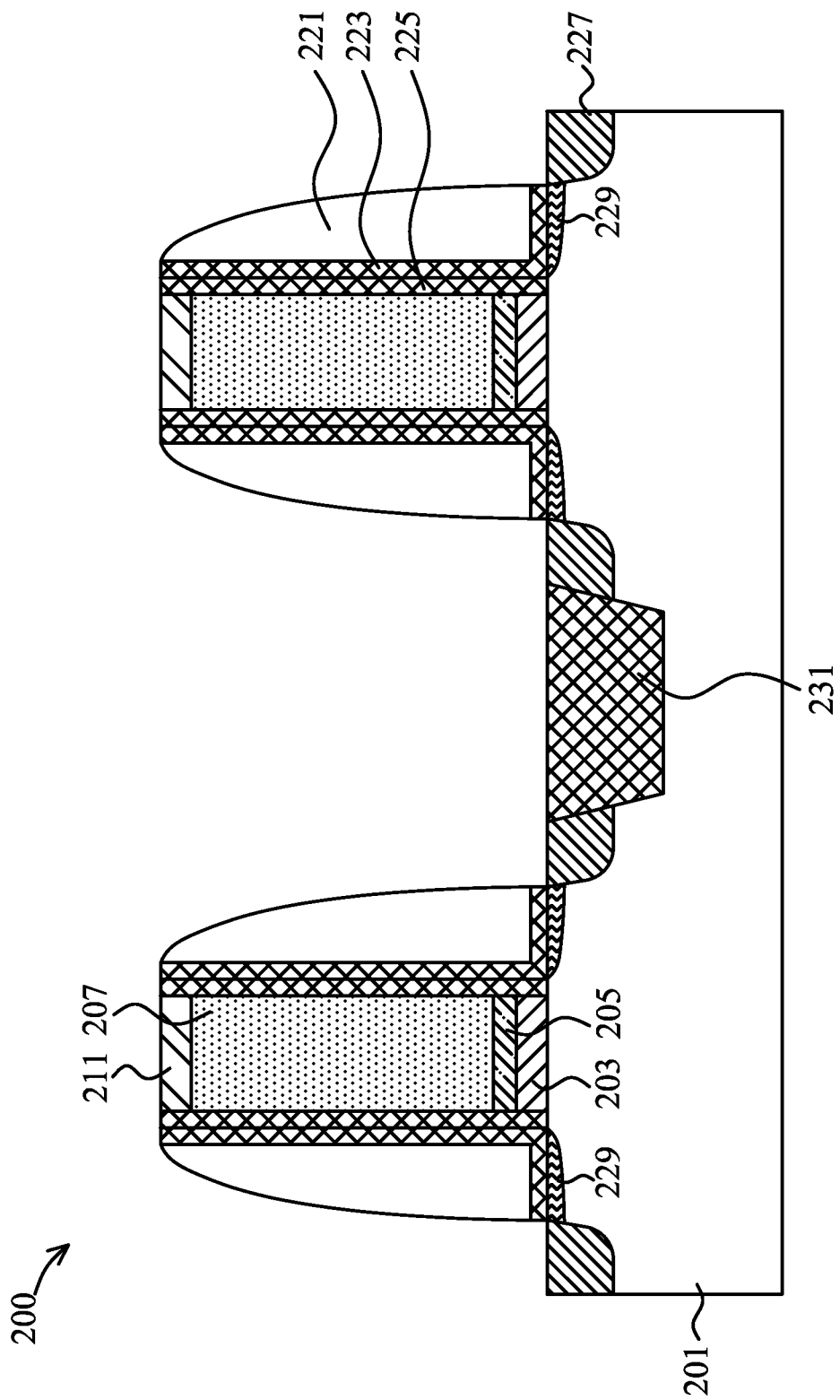

Operation 107 involves forming lightly doped source and drain (LDD) regions. Operation 107 includes an ion implantation process that uses dummy gate stacks 228 to help control the implant profile and distribution. FIG. 5 shows the wafer 200 with LDD regions 229 formed in the semiconductor substrate 201 adjacent to the passivation layer 225.

Operation 109 involves forming spacers around the dummy gate stack. Before forming spacers, optional spacer liners are typically formed. As shown in FIG. 5, spacer liners 223 may be silica or silicate. The material of spacer liners 223 can be similar to the material of the passivation layer 225 if both layers are present. Generally, the passivation layer 225, the spacer liner 223, or both will be present. The spacers 221 may be silicon nitride or another material that has the properties of conformal deposition, a large etch selectivity against the dummy gate material (harder to etch than the dummy gate material) and a passive material that can trap implanted dopants. A spacer material is first deposited over the wafer 200 covering the dummy gate stack and the areas between the dummy gate stacks. The spacer material is then etched back to remove the portions over the dummy gate stacks and in the field between the gate stacks as well as any spacer liner material under these portions. By tuning the etch process, a selected portion 221 of the spacer material around the dummy gate stack remains after the etch back.

In operation 111, source and drain regions are doped. The doping processes are typically an ion implantation using spacers 221 to align the implant profile and distribution. FIG. 5 shows the wafer 200 with source and drain regions 227 formed in the semiconductor substrate 201 adjacent to the spacers 221.

After ion implantation, the wafer 200 is annealed to repair implant damage and activate the dopants. However, according to various embodiments, the wafer may also be annealed after removing the dummy gate material (operation 117) in addition to immediately after the implantation. The anneal subjects the wafer to a high temperature of between about 500 degrees Celsius to about 1000 degrees Celsius.

Figure 6:
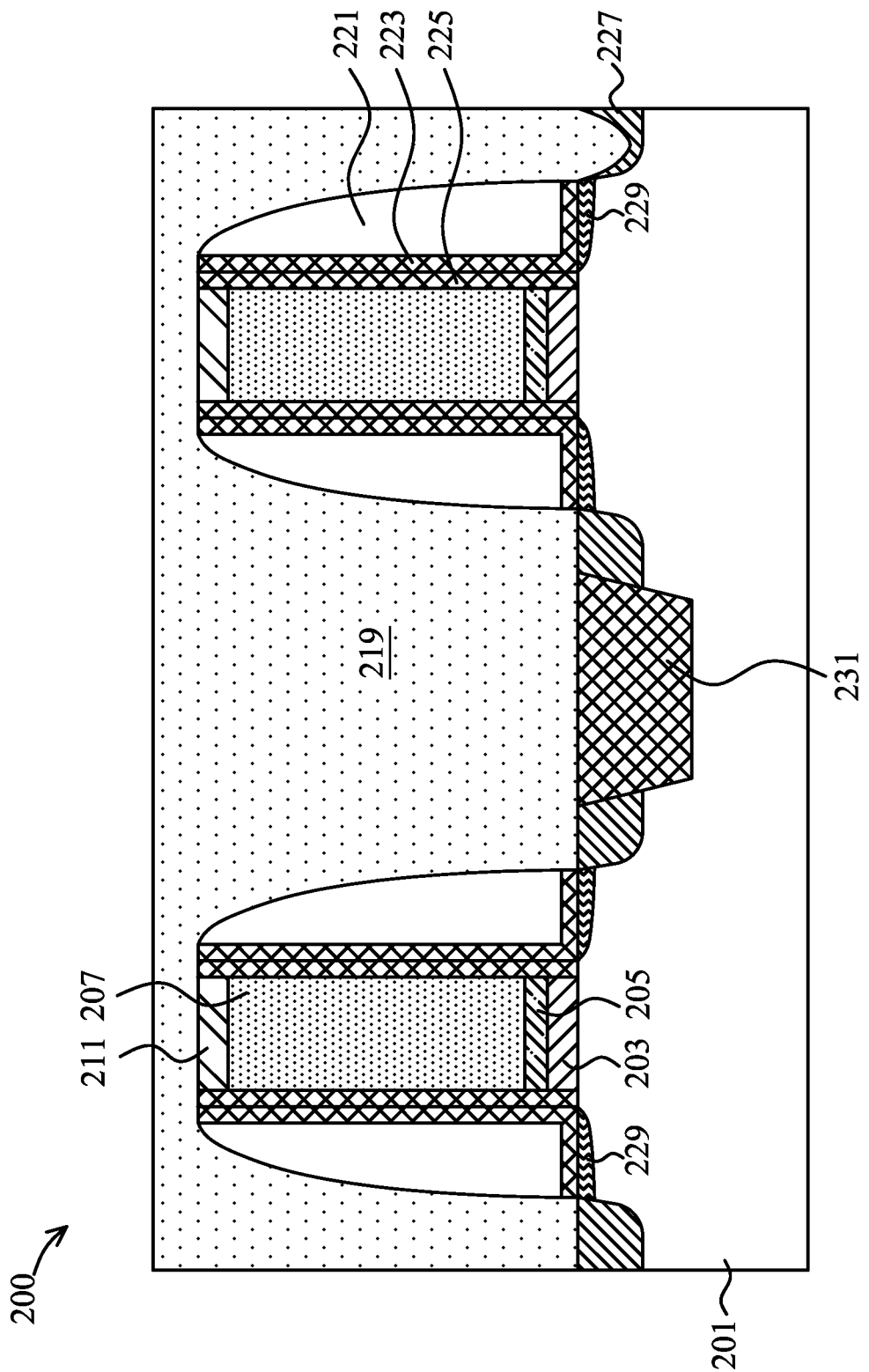

Operation 115 involves forming a tensile inter-level dielectric (ILD) layer 219, as illustrated in FIG. 6. A suitable tensile dielectric adheres well to the spacers around the dummy gate stack and can be made more dense, or shrink, with additional processing to change the metal gate profile after the dummy gate material is removed from the dummy gate stack. Examples include silicon oxide and carbon doped silicon oxide formed from siloxane precursors, including alkoxysilane or tetraethoxylonesilane precursors, with a high aspect ratio process (HARP™) available from Applied Materials of Santa Clara, Calif. Other dielectric material that may be treated chemically, thermally, or radiantly to increase cross linkage and therefore shrink the material may be used. Examples include silicon oxycarbide and silicon hydroxycarbide. The tensile ILD may have a tensile stress up to 200 MPa as deposited. In one example, the tensile ILD is deposited with HARP™ using ozone and tetraethoxylonesilane (TEOS) at about 500 degrees Celsius in a sub-atmospheric chemical vapor deposition (SACVD) chamber. In other embodiments, the tensile ILD layer 129 could be stressed by exposure to ultra-violet (UV) radiation. Tensile ILD layer 219 can be multilayer structure including a plurality of dielectrics.

Figure 7:
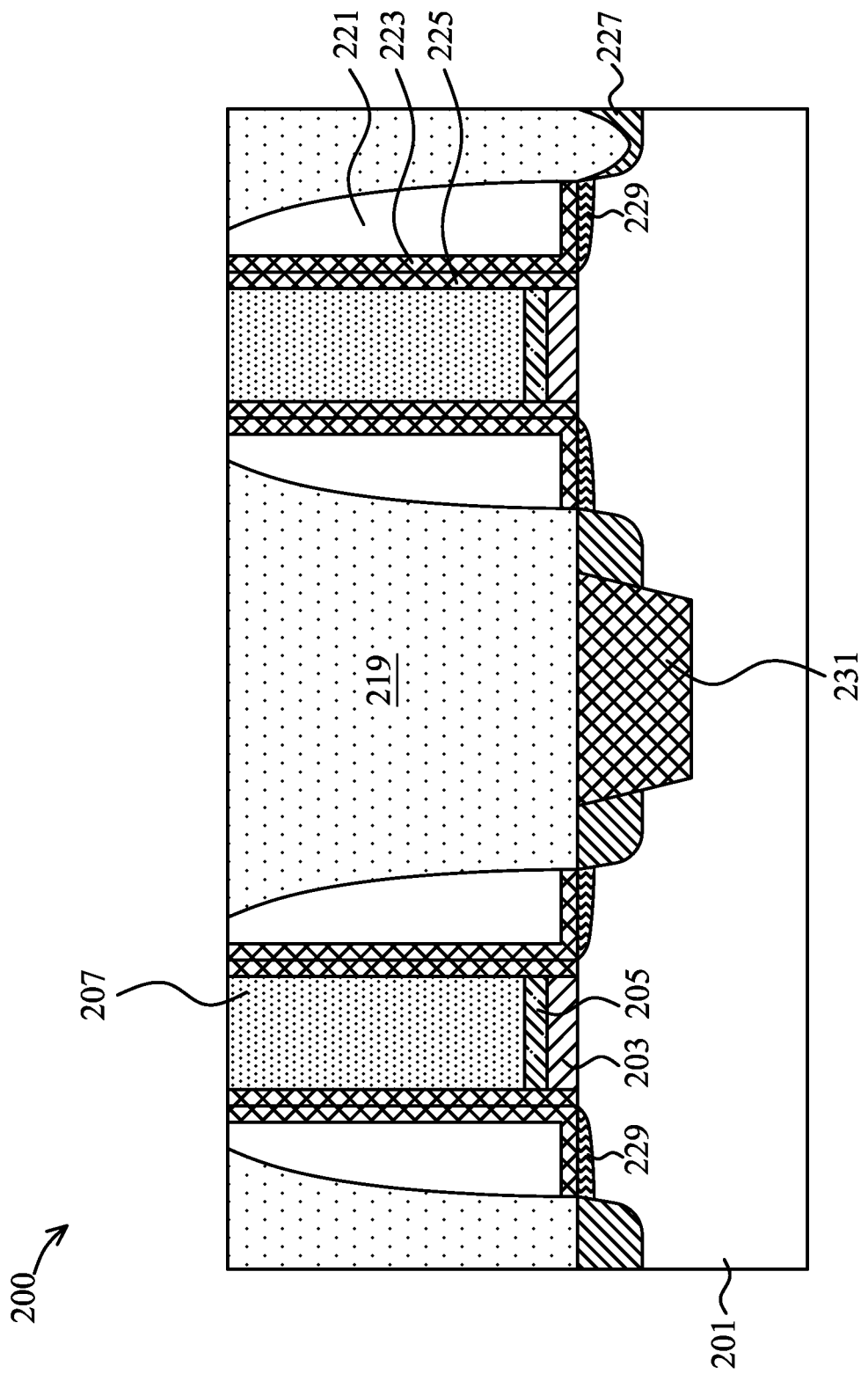

After the tensile ILD layer 219 is deposited, an upper surface of wafer 200 is planarized to lower the surface to the level of the dummy gate layer 207. Planarization is generally accomplished by chemical mechanical polishing (CMP). The surface does not become truly planar, as CMP invariably removes disparate materials at rates that vary at least slightly. If the mask 209/hard mask features 211 are still present at this stage, it is removed by the planarization process. After planarizing, the dummy gate layer 207 is either exposed or covered by only a thin layer of material. After the planarizing, the dummy gate layer 207, the passivation layer 225, the spacer liner 223, the spacers 221, and the tensile ILD layer 219 all approximately have the same height, as illustrated in FIG. 7.

In operation 117, the dummy gate material is removed from the dummy gate stack. The dummy gate material is removed in one or many etch operations including wet etch and dry etch. According to various embodiments, a hardmask is patterned over the wafer 200 to protect tensile ILD layer and spacers. In some embodiments, a first etch process breaks through native oxide layers on the dummy gate material and a second etch process reduces the thickness of the dummy gate material. In one embodiment, the dry etch for polysilicon dummy gate material utilizes a gas composition of 50-90% $CHF_3$ or $Cl_2$, 20-30% HBr, 10-50% $O_2$, and inert gases such as Ar and He, source power from 500-1000 W, and a source bias from 0-30 W. The dummy gate material etch may stop at the gate dielectric layer or continues to the interfacial layer or the semiconductor substrate below. In some embodiments, the entire dummy gate stack is removed. In other embodiments, only the dummy gate material is removed. However, the etch processes usually removes some surrounding material such as the passivating layer around the dummy gate stack, the spacer liner, and in some cases a portion of the spacer.

Figure 8:
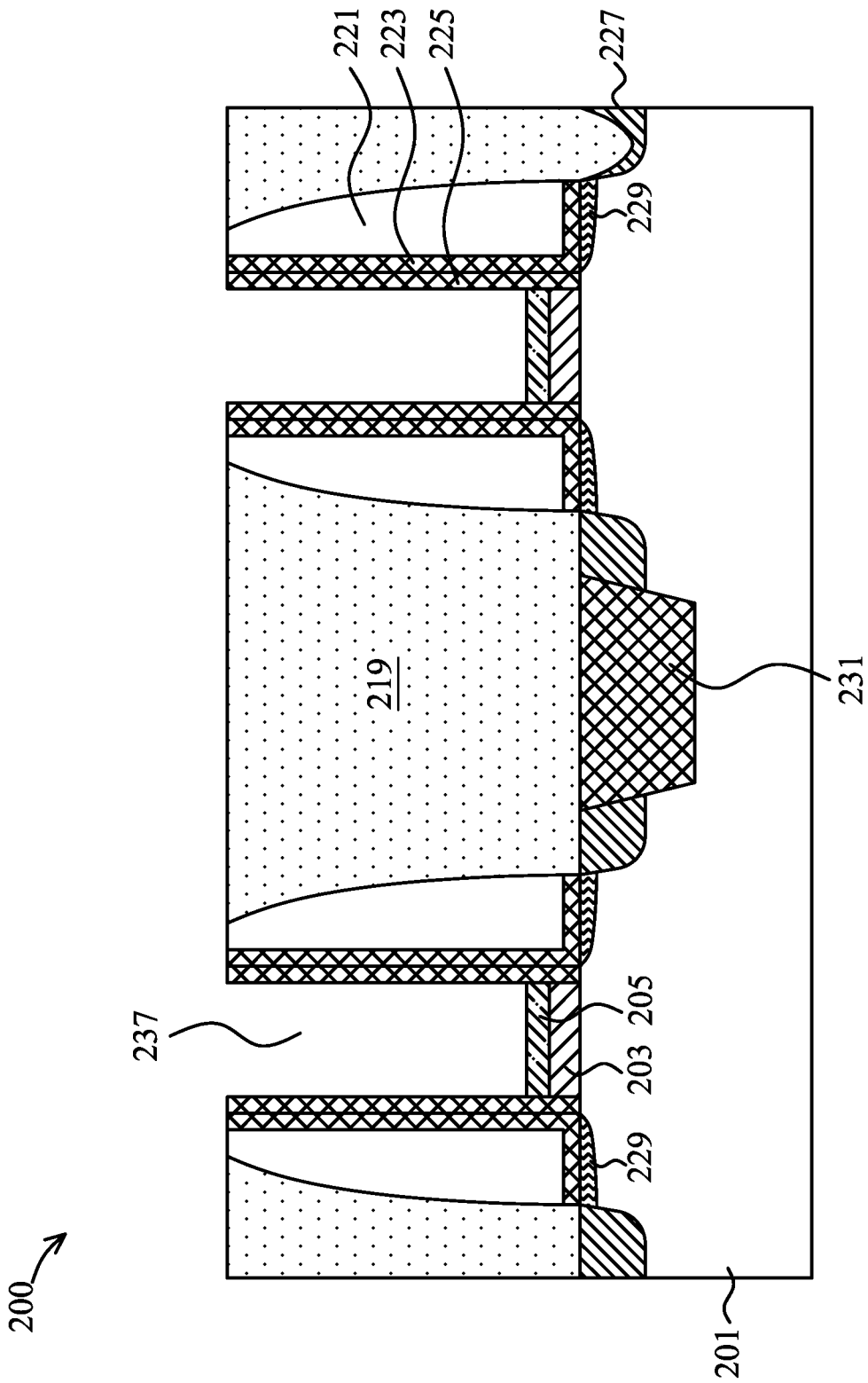
Figure 9:
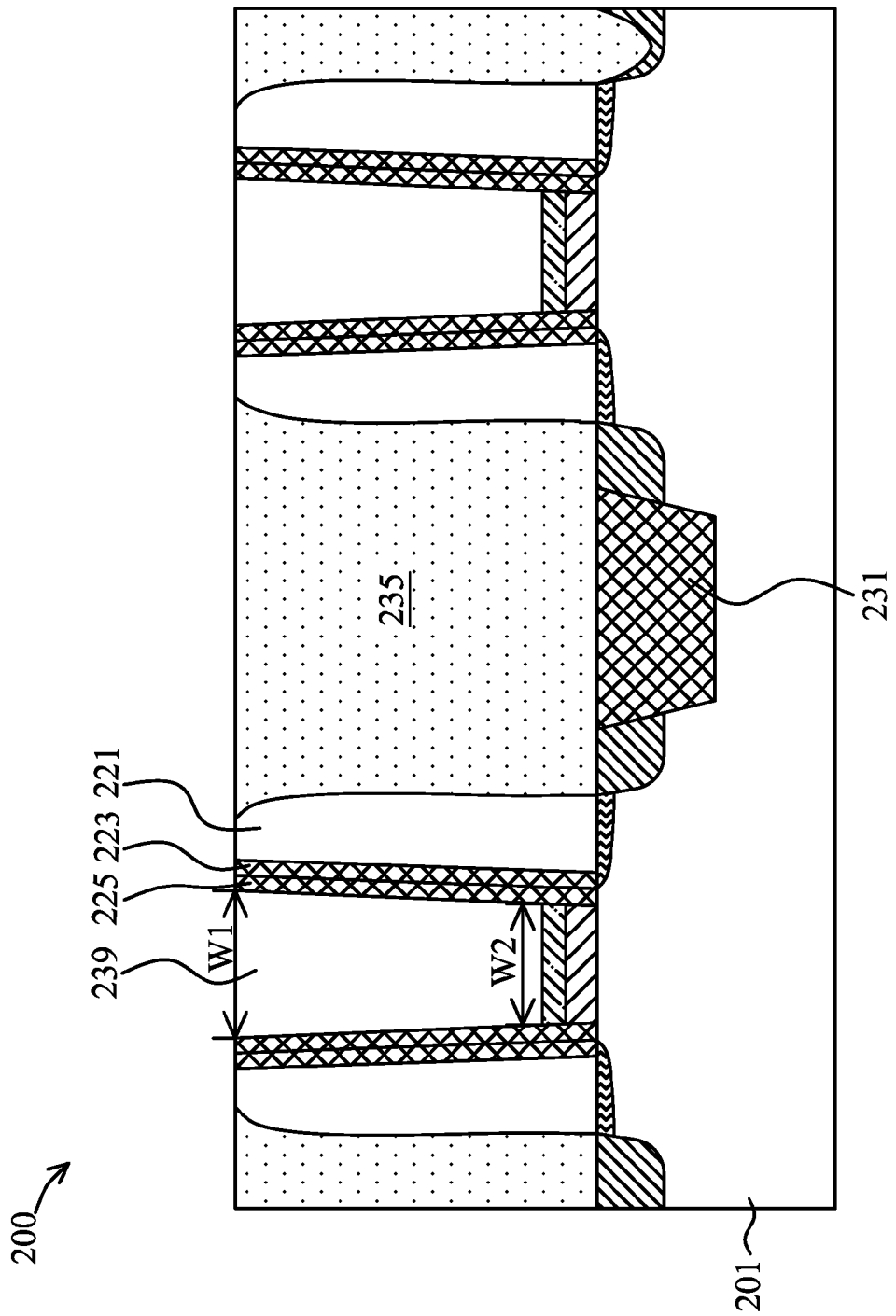

FIG. 8 is a cross section of wafer 200 after the dummy gate material removal operation 117. A trench 237 is formed between the spacers 221. As discussed, the gate dielectric 205 may also be removed. If it is, then a gate dielectric is deposited in a separate operation.

Referring back to FIG. 1, in operation 119 the wafer is annealed or treated to stress the tensile ILD layer. As discussed, the wafer may be annealed in operation 113 after the implantation of operation 111 to activate the implanted dopants and repair implant damage. The amount of total annealing in operations 113 and 119 is calculated to not exceed that used for implant repair and dopant activation. Exceeding a total anneal may cause excessive dopant migration and form an undesirable dopant profile. Depending on the ILD material used, this anneal may increase the silicon-oxygen-silicon cross linking and thereby increase the density and shrinks the tensile ILD layer. According to some embodiments, the tensile ILD layer anneal of operation 119 includes subjecting the wafer to a temperature greater than about 600 degrees Celsius. In some embodiments, the temperatures used in the tensile ILD anneal does not affect the implant anneal.

In certain embodiments, the annealing operation 119 is performed after depositing the tensile dielectric layer of operation 115 and before removing the dummy gate material in operation 117. It is believed that as the dummy gate material is removed, the tensile force from the ILD layer moves the spacers away from the dummy gate. In some cases, annealing the ILD layer before removing the dummy gate material facilitates the dummy gate removal. In certain embodiments, annealing before removing the dummy gate material avoids oxidizing material underlying the dummy gate material.

In other embodiments, the tensile ILD layer is treated to stress and densify the tensile ILD layer using a chemical treatment. The tensile ILD layer may be exposed to an acid vapor which reacts with residual hydrogen bonds, carbon, and/or water in the tensile ILD layer. Example acid vapors include hydrofluoric (HF) acid, hydrochloric (HCl) acid. The by-products are outgasses and removed from the wafer 200. The acid vapor treatment also results in a denser and more cross-linked tensile ILD layer. In yet other embodiments, the tensile ILD layer may be exposed to ultraviolet radiation to shrink, densify and increase cross-linking.

Because the tensile ILD layer adheres well to the spacers 221, the shrinking warps the spacers 221, spacer liner 223, and the passivation layer 225 to alter the profile of the trench 237. The wafer 200 of FIG. 9 includes the treated tensile ILD layer 235 between the spacers 221, spacer liner 223, and passivation layer 225 that are tilted toward the tensile ILD layer 235 at an angle. The trench 239 of FIG. 9 differs from trench 237 of FIG. 8 such that the top of the trench opening W1 is larger than the bottom width of the trench W2. The profile of trench 239 is tapered, while the trench 237 may be vertical or reentrant. The tapered profile of trench 239 is easier to fill without pits or voids.

According to various embodiments, a difference between W1 and W2, usually W1–W2, is between about 0 nm to about 3 nm. The ILD material is selected to have a degree of shrinkage that forms a trench 239 of a desirable profile. However, if the treated tensile ILD layer 235 and the spacers 221 delaminate from each other during the anneal treatment, then the trench 239 would not have the desired profile.

Referring back to FIG. 1, the method 100 then proceeds to operation 121 where the trench is filled with a metal gate material. The metal gate formed may also include gate dielectric layer(s), capping layer(s), fill layer(s), and/or other suitable layers that are removed in operation 117 or are desirable in a metal gate stack. A work function metal layer included in the metal gate may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function layer(s) may be deposited by CVD, PVD, electroplating and/or other suitable process. In an embodiment, the metal gate formed is a p-type metal gate including a p-type work function layer. The metal gate, as filled, as a trapezoidal profile having a wider top than bottom.

A dielectric layer of the metal gate structure may include a high-k dielectric layer such as hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, or other suitable material. The dielectric layer may be formed by ALD and/or other suitable methods. The dielectric layer may be the same as or differently composed than the dielectric layer formed in the gate structure described above in operation 101.

A fill layer of the metal gate structure may include Al, W, or Cu and/or other suitable materials. The fill metal may be formed by CVD, PVD, plating, and/or other suitable processes. The fill metal may be deposited over a work function metal layer(s), and thereby filling in the remaining portion of the trenches or openings.

Figure 10:
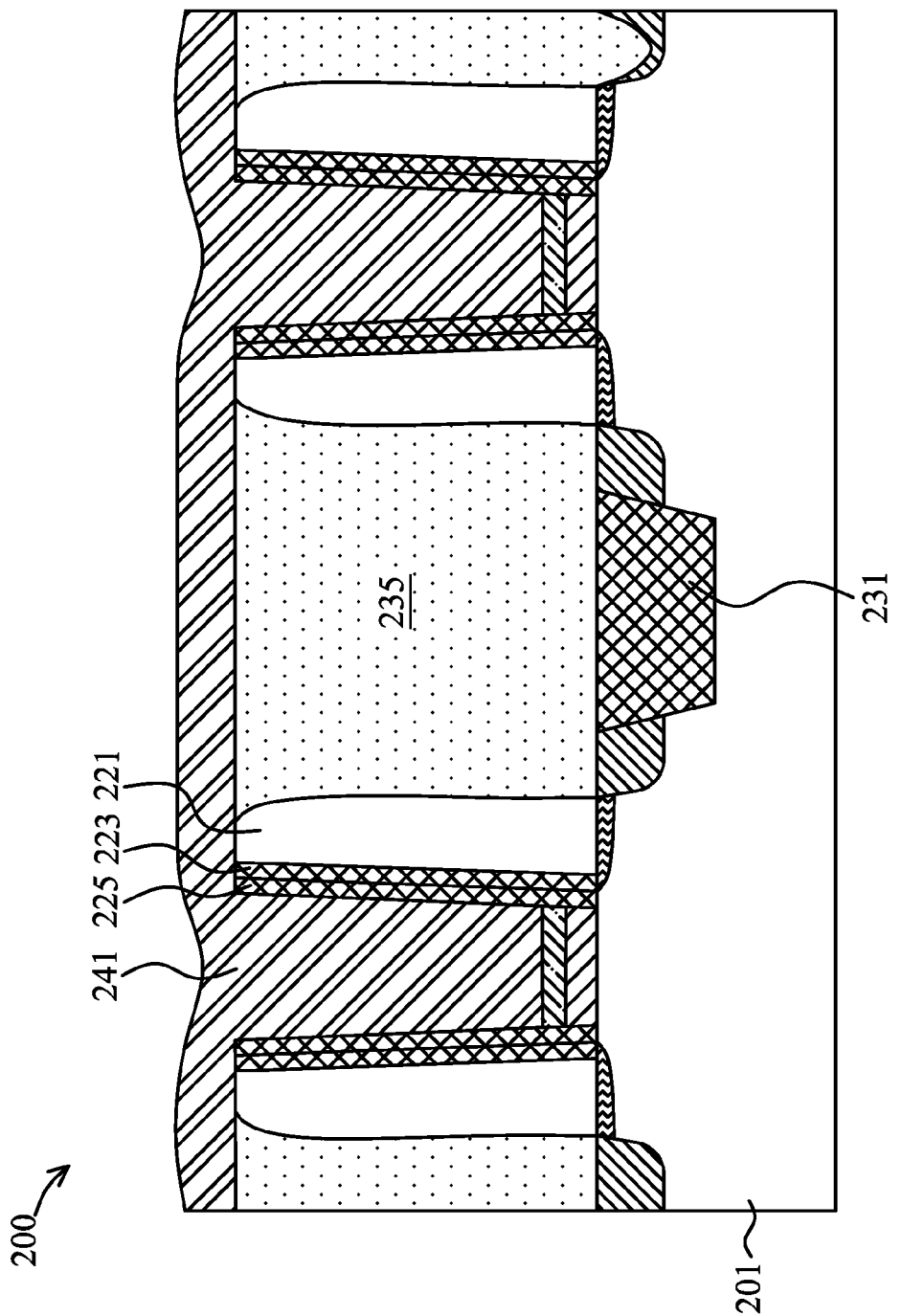
Figure 11:
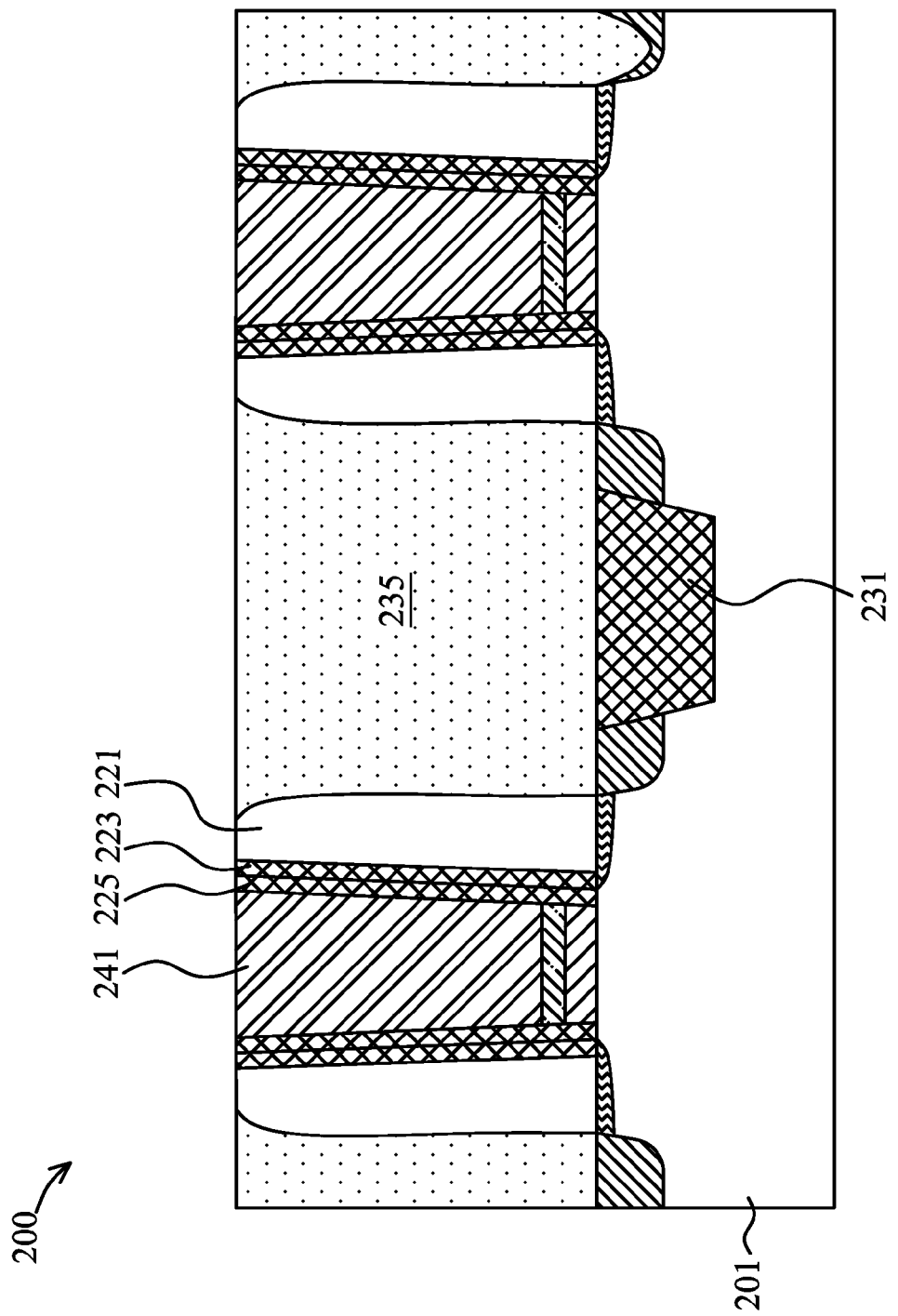

FIG. 10 is a cross section of wafer 200 having one or more layers of metal gate material 241 filling the trenches. In order to completely fill the trenches, more metal may be deposited in other regions, causing an uneven surface as shown. In operation 123 the metal gate is planarized. As shown in FIG. 11, the planarization removes the metal gate material 241 from the surface of the dielectric layer 235. After the replacement gate is formed, the transistor fabrication proceeds to various operations including contact and interconnect formation.

One aspect of the description relates to a device including a plurality of metal gate structures including a high-k gate dielectric layer and a metal layer and a tensile inter-level dielectric (ILD) layer between the metal gate structures. The metal layer has a top width larger than a bottom width. The tensile ILD layer may include a silicon oxide, silicon oxycarbide, or silicon hydroxycarbide.

Another aspect of the description relates to a method of making a semiconductor device forming a number of dummy gate structures including a first gate dielectric layer and a dummy gate material layer overlying the first gate dielectric layer, depositing a tensile ILD layer between the dummy gate structures, stressing the tensile ILD layer, removing at least the dummy gate material to form a number of trenches, and depositing a metal gate material in the trenches, which have a tapered profile. The tensile ILD layer may be a silicon oxide formed using a high aspect ratio process (HARP).

While the description is presented by way of examples and in terms of specific embodiments, it is to be understood that the invention is not limited to the disclosed embodiments. To the contrary, it is intended to cover various modifications and similar arrangements (as would be apparent to those skilled in the art). The above description discloses representative steps, but they are not necessarily required to be performed in the order described. Steps can be added, replaced, changed in order, and/or eliminated as appropriate, in accordance with the spirit and scope of the description. Embodiments that combine different claims and/or different embodiments are within the scope of the description and will be apparent to those skilled in the art after reviewing this disclosure. Therefore, the scope of the appended claims should be accorded the broadest interpretation so as to encompass all such modifications and similar arrangements.

What is claimed:

1. A method of fabricating a semiconductor device, the method comprising:
    forming a plurality of dummy gate structures including a first gate dielectric layer and a dummy gate material layer overlying the first gate dielectric layer;
    depositing a tensile ILD layer between the plurality of dummy gate structures;
    removing at least the dummy gate material from the plurality of dummy gate structures to form a plurality of trenches;
    after removing the at least the dummy gate material, stressing the tensile ILD layer by at least one of annealing, chemically treating, and exposing to UV radiation; and
    after stressing the tensile ILD layer, depositing a metal gate material in the plurality of trenches, wherein each of the plurality of trenches has a tapered profile.

2. The method of claim 1, wherein the depositing a tensile ILD layer exposes an area between the plurality of dummy gate structures to a siloxane precursor in a high aspect ratio process (HARP).

3. The method of claim 2, wherein the depositing a tensile ILD layer also includes exposing the siloxane precursor to a remote plasma.

4. The method of claim 2, wherein the siloxane precursor is an alkoxysilane precursor.

5. The method of claim 1, wherein the at least the dummy gate material includes material of the first gate dielectric layer and the method further comprises depositing a second gate dielectric.

6. The method of claim 5, wherein the second gate dielectric comprises $HfO_2$, $TiO_2$, HfZrO, $Ta_2O_3$, $HfSiO_4$, $ZrO_2$, or $ZrSiO_2$.

7. The method of claim 1, wherein the first gate dielectric layer is a high k dielectric layer having a dielectric constant, k, greater than or equal to about 4.0.

8. The method of claim 1, wherein the depositing a metal gate material comprises depositing a work function metal and a fill metal.

9. The method of claim 1, wherein the tensile ILD layer has a tensile stress of about 200 MPa to about 1400 MPa after the stressing.

10. The method of claim 1, wherein the dummy gate material layer is polysilicon.

11. A method of fabricating a semiconductor device, the method comprising:
    forming a plurality of dummy gate structures including a first gate dielectric layer and a dummy gate material layer overlying the first gate dielectric layer;
    depositing a tensile ILD layer between the plurality of dummy gate structures;
    stressing the tensile ILD layer with at least one of an annealing process, a chemical treatment process, and a UV radiation exposure process; after stressing the tensile ILD layer, removing at least the dummy gate material from the plurality of dummy gate structures to form a plurality of trenches; and
    depositing a metal gate material in the plurality of trenches, wherein each of the plurality of trenches has a tapered profile.

12. The method of claim 11, wherein the depositing a tensile ILD layer includes exposing an area between the plurality of dummy gate structures to a siloxane precursor in a high aspect ratio process (HARP) and exposing the siloxane precursor to a remote plasma.

13. The method of claim 12, wherein the siloxane precursor is an alkoxysilane precursor.

14. The method of claim 11, wherein the at least the dummy gate material includes material of the first gate dielectric layer and the method further comprises depositing a second gate dielectric.

15. The method of claim 14, wherein the at least the dummy gate material comprises polysilicon.

16. The method of claim 11, wherein the depositing a metal gate material comprises depositing a work function metal and a fill metal.

17. The method of claim 11, wherein the tensile ILD layer has a tensile stress of about 200 MPa to about 1400 MPa after the stressing.

18. A method of fabricating a semiconductor device, the method comprising:
- forming a plurality of dummy gate structures including a first gate dielectric layer and a dummy gate material layer overlying the first gate dielectric layer;
- depositing a tensile ILD layer between the plurality of dummy gate structures;
- annealing the tensile ILD layer;
- after annealing the tensile ILD layer, removing at least the dummy gate material from the plurality of dummy gate structures to form a plurality of trenches; and
- depositing a metal gate material in the plurality of trenches, wherein each of the plurality of trenches has a tapered profile.

19. The method of claim 18, wherein the tapered profile has a width difference between a width of an upper portion of the tapered profile and a width of a lower portion of the tapered profile of up to about 3 nm.

20. The method of claim 19, wherein the width of the upper portion of the tapered profile is larger than the width of the lower portion of the tapered profile.

\* \* \* \* \*